United States Patent

Chen et al.

[11] Patent Number: 5,835,751
[45] Date of Patent: Nov. 10, 1998

[54] STRUCTURE AND METHOD FOR PROVIDING RECONFIGURABLE EMULATION CIRCUIT

[75] Inventors: Nang-Ping Chen, Cupertino; Robert J. Ko, Saratoga; Jeong-Tyng Li, Cupertino; Thomas B. Huang, San Jose; Ming-Yang Wang, Lafayette, all of Calif.

[73] Assignee: Quickturn Design Systems, Inc., Mountain View, Calif.

[21] Appl. No.: 893,412

[22] Filed: Jul. 11, 1997

Related U.S. Application Data

[63] Continuation of Ser. No. 472,531, Jun. 7, 1995, Pat. No. 5,649,167, which is a continuation of Ser. No. 829,181, Jan. 31, 1992, Pat. No. 5,475,830.

[51] Int. Cl.[6] .................................................. G06F 9/44
[52] U.S. Cl. .................................... 395/500; 327/39
[58] Field of Search ........................... 395/500, 527, 395/551, 555, 556; 364/488–491; 257/209, 529; 326/37, 38, 39

[56] References Cited

U.S. PATENT DOCUMENTS 5,715,172 2/1998 Tzeng ...................................... 364/490

*Primary Examiner*—Kevin J. Teska
*Assistant Examiner*—Dan Fiul
*Attorney, Agent, or Firm*—Lyon & Lyon LLP

[57] ABSTRACT

A method and a structure provide emulation circuit implemented on a logic block module comprising clocked and unclocked field programmable logic devices (FPGAs). Software modules analyze the target logic circuit and impose delay constraints to require certain storage instances to be implemented on separate FPGAs so as to prevent hold time violation artifacts.

4 Claims, 15 Drawing Sheets

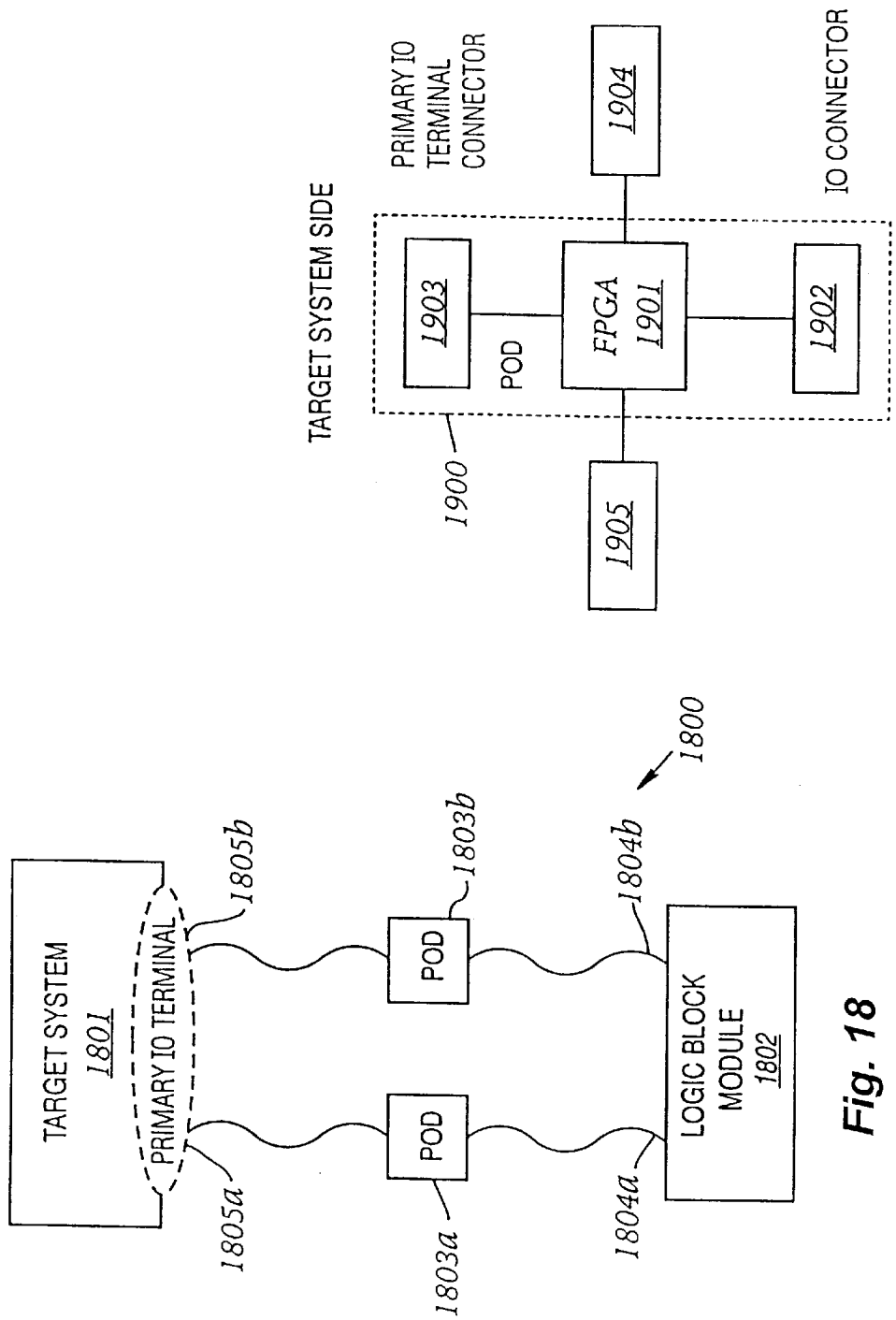

STRUCTURE AND METHOD FOR PROVIDING RECONFIGURABLE EMULATION CIRCUIT

This application is a continuation of application Ser. No. 08/472,531, now U.S. Pat. No. 5,649,162 filed on Jun. 7, 1995, which is a continuation of application having Ser. No. 07/829,181 filed on Jan. 31, 1992, now issued as U.S. Pat. No. 5,475,830

BACKGROUND OF THE INVENTION

1. Field of the Invention

The present invention relates to integrated circuits, and in particular relates to using programmable logic devices to emulate logic circuits.

2. Discussion of Related Art

In developing an integrated circuit ("target logic circuit"), it is often necessary to provide an implementation of the design in a development system prior to committing the design to a final implementation, such as an ASIC (application specific integrated circuit) or a custom integrated circuit design. Such implementation in a development system is used not only for debugging the integrated circuit, but also for developing systems ("target systems") which will use the integrated circuit. Two methods for providing an implementation of the design at the development stage are software simulation and hardware emulation.

Software simulation of electronic circuit designs has become an important tool for designers. Simulation allows a design to be validated without using a hardware implementation. However, software simulation are limited in at least three aspects. Firstly, compared to the actual operating speed of the target logic circuit, software simulation is slow. Secondly, constructing simulation models is required to capture certain operating characteristics of the target logic circuit, such as circuit delay. Lastly, where some part of a design has been implemented in hardware, it is virtually impossible, although desirable, to use software simulation to connect software simulated parts of the circuit to the implemented hardware so as to provide a simulation of the total design.

Alternatively, a class of hardware simulators, called "VLSI emulators", can be used to achieve near real time in-circuit emulation. VLSI emulators converts a logic circuit design description or representation into a temporary operating hardware form ("emulation circuit") using reprogrammable logic devices, such as an array of interconnected field programmable gate arrays. Even then, there are several limitations of today's emulation technology.

A first disadvantage of the prior art is an error condition known as "hold time violation artifact". Hold time violation artifact is an error condition arising in an emulation circuit having relatively complex clocking structure. This error condition results from the fact that clock skews in the emulation circuit are frequently different from the clock skews of the target logic circuit, because limited resources in reprogrammable logic devices are designed to support the generation and routing of clock signals. Thus, since the error condition is an artifact of the emulation circuit, hold time violation may not actually occur in the target logic circuit. Because today's designs are large and often requiring complex clocking schemes, hold time violation artifact can be expected to occur in all but very simple emulation circuits.

A practical VLSI emulator is required to take a large design, partitions such a design to implement the circuit over hundreds of field programmable gate arrays, and then interconnects these field programmable gate array to arrive at a functional emulation circuit. Because an effective strategy is lacking in the prior art for partitioning components of the target logic circuit to minimize interconnection delays and interchip connections, another disadvantage of the prior art is the unsatisfactory circuit performance (i.e. speed) of the emulation circuit, due to avoidable delays of both long interconnection paths within a programmable logic device and interchip interconnections.

A third disadvantage of the prior art is the low utilization efficiency of programmable logic devices. Such low utilization efficiency arises because the numerous interconnections between field programmable gate arrays quickly use up the available I/O pins before a high percentage of the available gates are utilized.

U.S. Pat. No. 5,036,473 to M. Butts et al., entitled "Method of Using Electronically Reconfigurable Logic Circuits", filed Oct. 4, 1989, issued Jul. 30, 1991, describes a method using a number of reprogrammable gate array logic chip to implement a logic circuit.

Similarly, European Patent Application entitled "Apparatus for Emulation of Electronic Hardware System," by S. Sample et al, discloses configurating an array of programmable logic arrays to provide an emulation circuit.

However, neither Butts et al. nor Sample et al. addresses the problems of hold time violation artifact, and utilization and delay optimizations. Thus, for any design of practical size and complexity, the methods of Butts et al. and Sample et al achieve a functional circuit only after considerable manual debugging.

SUMMARY OF THE INVENTION

In accordance with the present invention, a method and a structure provide an emulation circuit without hold time violation artifact, by introducing a delay in a data path between two storage instances ("different clock storage instances") clocked by different clock signals from the same clock source. Also, in accordance with the present invention, the emulation circuit provides high circuit performance by clustering storage instances with their respective clock and data paths.

In one embodiment, a clock analysis module examines the clock signal of each storage instance and traces the clock path between the clock signal and the clock source from which the clock signal is derived. In accordance with the present invention, a programmable logic device ("clock generation FPGA") is then dedicated to generate a portion of the clock paths ("global clock paths") identified. The remaining clock paths ("local clock paths") are generated in programmable logic devices implementing the emulation circuit.

In one embodiment, in addition to providing the clock generation FPGA, some storage instances clocked by clock signals derived from the same clock source are implemented in separate clocked programmable logic devices. In that embodiment, a portion of the data path or paths between a pair of such clock storage instances is implemented in an unclocked programmable logic device.

In one embodiment, in addition to the clock analysis module identifying clock paths, a clustering module clusters each storage instance with (i) the data paths leading to a data input terminal of the storage instance and (ii) the local clock path of the clock signal to the storage instance. A partition module assigns the components of each cluster to be implemented by the same programmable logic device so as to minimize delay in the data path. In that embodiment, "different clock" storage instances are assigned different clocked programmable logic devices ("clocked FPGAs"), and the delay of the delay constraint is provided by an unclocked programmable logic device ("unclocked FPGA"). Further, a connectivity module provides a connectivity graph indicating connectivity between clusters. Additionally, a data structure associated with a component common to multiple clusters notes the clusters in which the component is present. When a pair of clusters having duplication are implemented in separate programmable devices, the common circuits are duplicated in each programmable device to minimize the need for interchip interconnections, and preserve circuit performance.

The present invention is better understood upon consideration of the detailed description below and the accompanying drawings.

BRIEF DESCRIPTION OF THE DRAWING

FIG. 14 also illustrates why, in the present embodiment, delay constraints need not be imposed on same clock storage instances.

FIG. 18 shows a configuration 1800 in which a logic block module 1802 is interfaced to a target system 1801 via pods 1803a and 1803b, in accordance with the present invention.

FIG. 19 shows the construction of a pod 1900, for use as, for example, pod 1803a of FIG. 19.

DETAILED DESCRIPTION OF A PREFERRED EMBODIMENT

The present invention provides a method and structure to implement an emulator circuit from a netlist description. The emulator circuit is implemented in a "logic block module," which is a circuit comprising I/O connectors, clocked programmable logic devices, unclocked programmable devices and a clock generation programmable logic device. The programmable logic devices used in the embodiments of the present invention described below can be commercially available field programmable gate arrays ("FPGAs"). Some examples of FPGAs are the Xilinx 3090 and the Xilinx 4005, both available from Xilinx Corporation of San Jose, Calif. FPGAs with 1000–2000 gates and 100 I/O (input/output) pins are widely available at this time.

Figure 1:
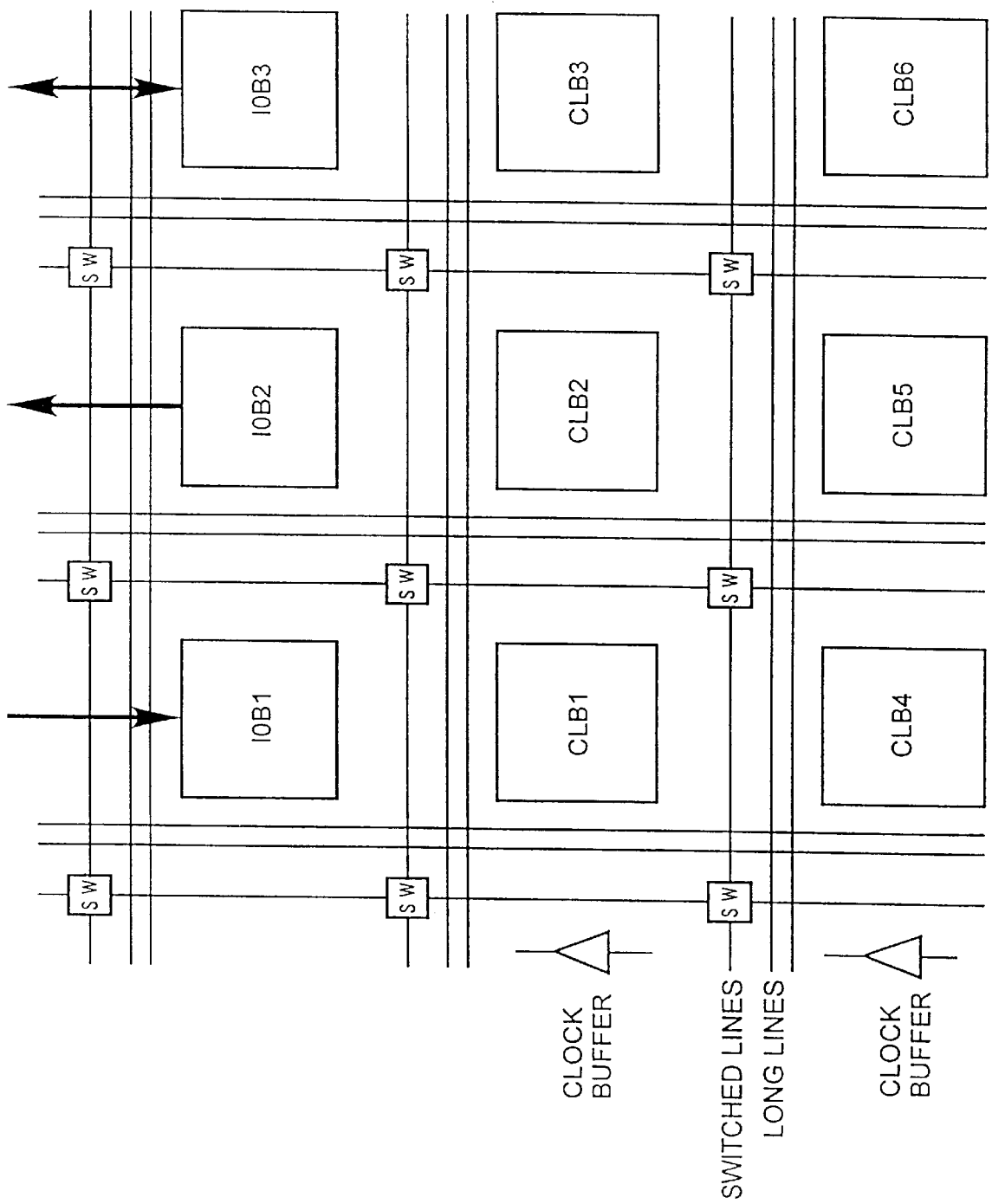
FIG. 1 is a block diagram showing the functional blocks of a field programmable logic device (FPGA) suitable for use as components in a logic block module of the present invention.

The architecture of one such FPGA 100 is shown in FIG. 1. As shown in FIG. 1, FPGA provides a number of input/output (I/O) pins (e.g. IOB1–IOB3) for receiving from an external circuit input signals or providing to an external circuit output signals. For each I/0 pin, there is associated an IOB structure which contains I/O buffer circuits to allow the I/O pin to be configured as an input, output, bidirectional pin, or other input/output configurations. In each FPGA, there are numerous configurable logic blocks (CLBs), e.g. CLB1–CLB6, which can each be programmed to provide a logic circuit. To create a functional logic circuit in an FPGA, the IOBs and CLBs are individually configured to the desired circuit, and then interconnected by "routing resources". A routing resource can be a general switch interconnection ("switch line") for routing data path signals, a special purpose signal line for routing clock signals ("long line"), or a special clock buffer resource providing skew control for clock signals. Clock buffers and long lines are designed to provide shorter interconnect delays than general switched connections. Generally, long lines and clock buffers are very limited resources. For example, in a Xilinx 4005 field programmable gate array, eight clock buffers are provided per integrated circuit. In the embodiments described below, however, a maximum of four of these clock buffers in each integrated circuit are used because an existing configuration software supplied by the FPGA vendor sometimes requires manual intervention for a logic circuit using more than four clock buffers. When a data path is connected across two programmable logic devices, the interconnect delay is larger than a general switched connection within the same programmable logic device, because of the I/O buffers and pin delays involved.

Figure 2:
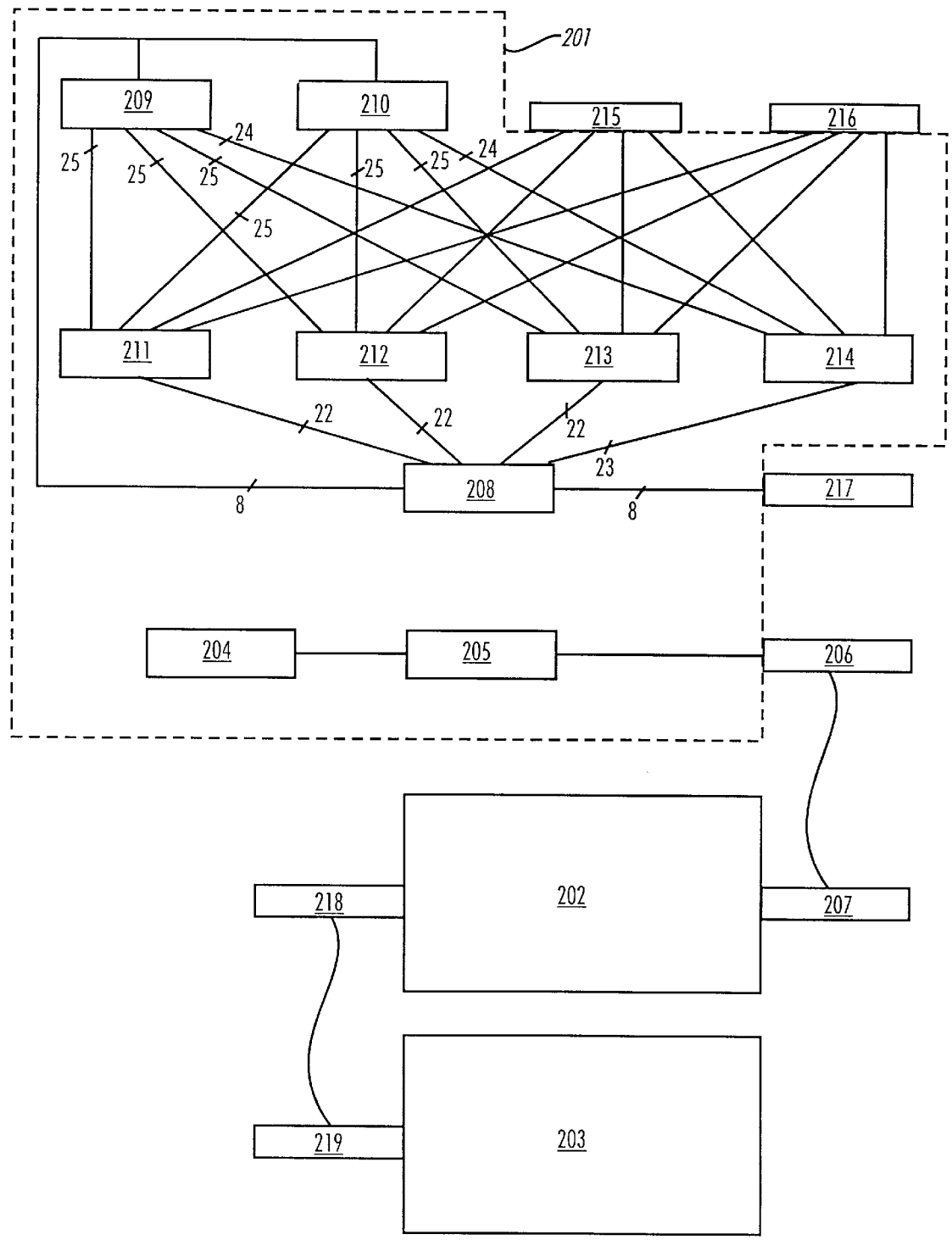
FIG. 2 shows a system comprising logic block module 201, FPGA configuration controller 202 and workstation 203, in accordance with the present invention.

FIG. 2 illustrates a system 200 comprising a logic block module 201, an FPGA configuration controller 202, and workstation 203. As mentioned above, the emulation circuit is implemented in a logic block module such as logic block module 201. Logic block module 201 comprises a clock generation FPGA, clocked FPGAs, unclocked FPGAs, I/O connectors, a non-volatile memory component, and a control FPGA. The clock generation FPGA, the clocked and unclocked FPGAs, and the I/O connectors are interconnected by metal conductive traces on the printed circuit board of logic block module 201. These metal traces provide insignificant signal delays, when compared to the delays of either the long lines, clock buffers or the switch lines inside an FPGA.

The non-volatile memory component, shown as EPROM 204, is provided for storing the software necessary to configure control FPGA 205, enable an interface with FPGA configuration controller 202. EPROM 204 can be implemented by any electrically erasable read-only memory (EPROM) or other suitable devices. Configured in control FPGA 205 is the control circuit for receiving from the FPGA configuration controller 202, through I/O connectors 206 and 207, the data for configurating the FPGAs of logic block module 201. In this embodiment, control FPGA 205 communicates with FPGA configuration controller 202 over an interface conforming to the JTAG standard[1]. The configuration data for programming the FPGAs of logic block module 201 can be provided to FPGA configuration controller 202 by workstation 203 over a standard Ethernet local area network.

[1]The JTAG standard is formally known as the "IEEE Std. 1149.1 Standard Test Access Port and Boundary Scan Architecture." A copy of the JTAG standard can be obtained from Institute of Electrical and Electronics Engineers, Inc., New York, N.Y. 10017.

The numbers of clocked and unclocked FPGAs, and I/O connectors shown in logic block module 201 of FIG. 2 are exemplary only. The present invention is not limited by the number of FPGAs and I/O connectors in a logic block module. For example, one embodiment, which is shown schematically in FIG. 3, has a logic block module comprising one clock generation FPGA (labelled 344), 28 clocked FPGAs (labelled respectively 301–328), 34 unclocked FPGAs (labelled respectively 345–378), 16 I/O connectors (labelled respectively 329–343, 379), one control FPGA (not shown) and one EPROM (not shown). In that embodiment, each I/O connector has 100 signal pins, of which 48 are can be used by the emulation circuit.

Also, in that embodiment, the clock generation FPGA, clocked FPGAs and unclocked FPGAs are implemented by Xilinx 4005 field programmable gate arrays, and the control FPGA is implemented by Xilinx 3090 field programmable gate arrays. A Xilinx 4005 FPGA has 112 I/O pins which can be configured. However, in the embodiment show in FIG. 3, only 99 I/O pins are available to the emulation circuit, when used as a clocked FPGA, 106 I/O pins are available to the emmulation circuit, when used as an unclocked FPGA, and 89 I/O pins are available to the emulation circuit, when used as a clock generation FPGA.

Figure 3:
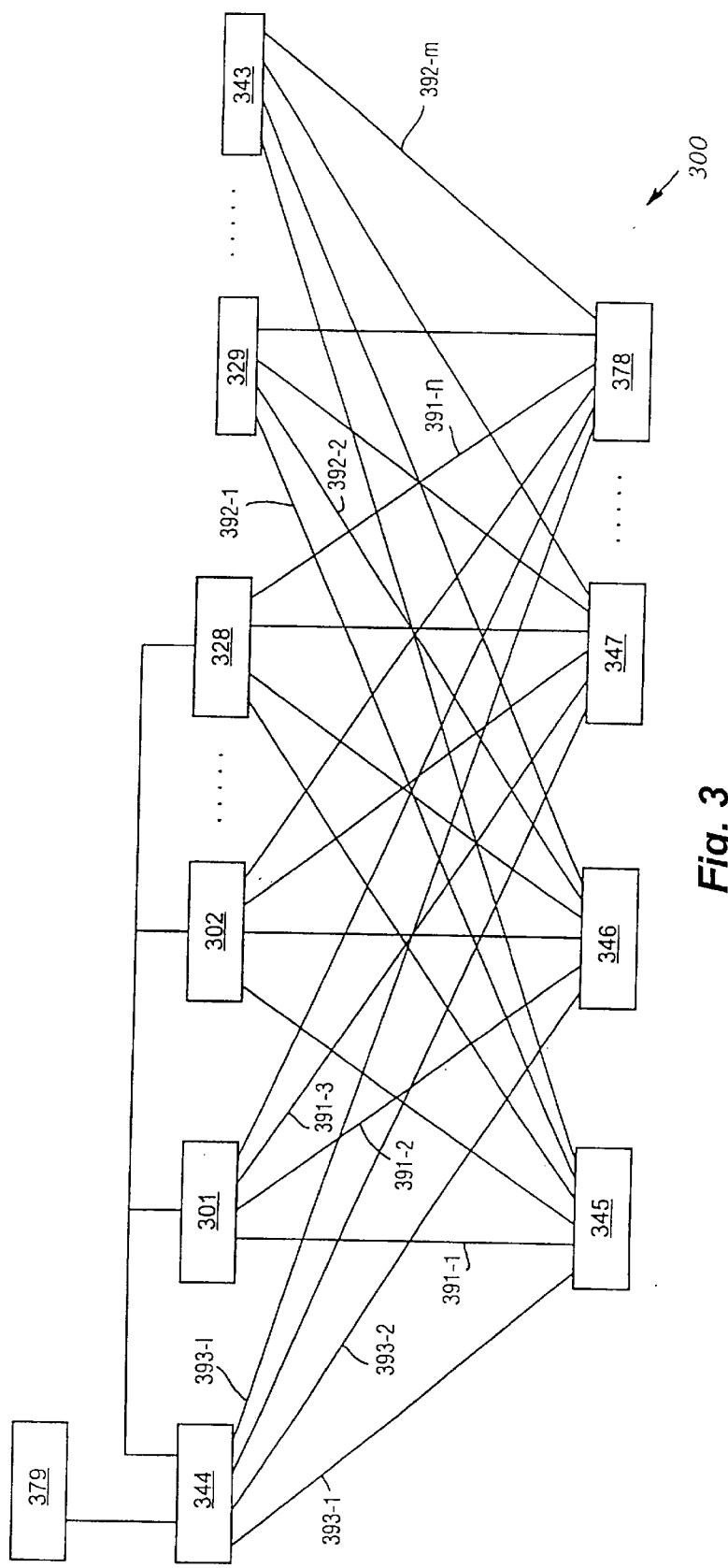
FIG. 3 shows logic block module 300 having clock generator FPGA 344, clocked FPGAs 301–328, unclocked FPGAs 345–378, and I/O connectors 329–343 and 379.

In both the embodiments of FIGS. 2 and 3, the I/O pins of each clocked FPGA, the clock generation FPGA or the signal pins of each I/O connector are distributed among all unclocked FPGAs as evenly as possible. For example, the 99 I/O pins of clocked FPGA 209 available to the emulation circuit are divided into 3 groups of 25 pins and 1 group of 24 pins, each group connecting to one of the unclocked FPGAs 211–214. In this architecture, the clock generation FPGA, shown in FIG. 2 as clock generation FPGA 208, provides the major system clock signals for the clocked FPGAS, such as clocked FPGAs 209 and 210 of FIG. 2. The clocked FPGAs are used to implement storage instances and data paths. Unclocked FPGAs, such as FPGAs 211–214 of FIG. 2, implements interconnections and data paths having only combinatorial circuits. The I/O connectors can be connected to a pod to interface a target system. The connections between each unclocked FPGA and the clock generation FPGA are provided to route clock qualifier signals (described below) between the clock generation FPGA and each unclocked FPGA, and not for routing clock signals.

In the embodiments of FIGS. 2 and 3, although by no means necessary, both clocked and unclocked FPGAs are implemented by the same programmable logic devices. The connections between the clocked FPGAs and the unclocked FPGAs (e.g. interconnection lines 391-1 391-n of FIG. 3), between the clock generation FPGA and the unclocked FPGAs (e.g. interconnection line 393-1 to 393-1), and between the unclocked FPGAs and the I/0 connectors (e.g. interconnection lines 392-1 to 392-m of FIG. 3) are realized by metal traces of insignificant delay on the printed circuit board of the logic block module, such as logic block module 201 of FIG. 2. In the embodiment of FIG. 3, other than interconnection functions, only combinatorial circuits each having a single input signal and a single output signal are implemented in unclocked FPGAs so as to providing an additional delay in the data path.

Figure 4:
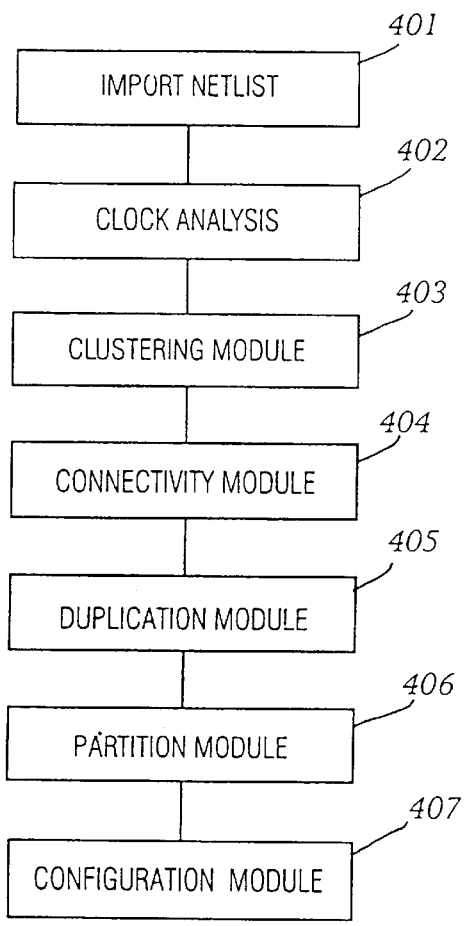
FIG. 4 is a block diagram showing certain software modules required to take a target logic design to a program for configuring an emulation circuit in a logic block module, in accordance with the present invention.

FIG. 4 is a flow diagram showing the steps required in the embodiment ("present embodiment") of FIG. 3 to transform a design into an emulator circuit implemented in the FPGAs of a logic block module. Each of the steps of FIG. 4 is accomplished by a software module described below. As shown in FIG. 4, block 401 represents the step of importing a netlist into the present embodiment. In this embodiment, a software module ("import module") running on a workstation reads a design netlist into a data structure of conventional design. Import module 401 can read netlists provided in a number of formats, including electronic design intermediate format (EDIF), Toshiba network description language (TDL), and network description language (NDL). These netlist formats are well known in the art.

Import module 401 also receives user's instructions regarding both the design and the configuration of the logic block module to be implemented. For example, the user can specify that the utilization of each FPGA in the emulation circuit should not exceed a certain percentage, so as to allow sufficient room in each FPGA for incremental modifications to the emulation circuit. Also, the user can provide to import module 401 information regarding the design helpful in subsequent steps, including the steps of clock analysis and partition described below. Such design information includes the names of "clock sources" and "clock qualifiers" (described below). The user can also specify groupings of circuit components which are desired to be implemented in the same FPGA.

Figure 5:
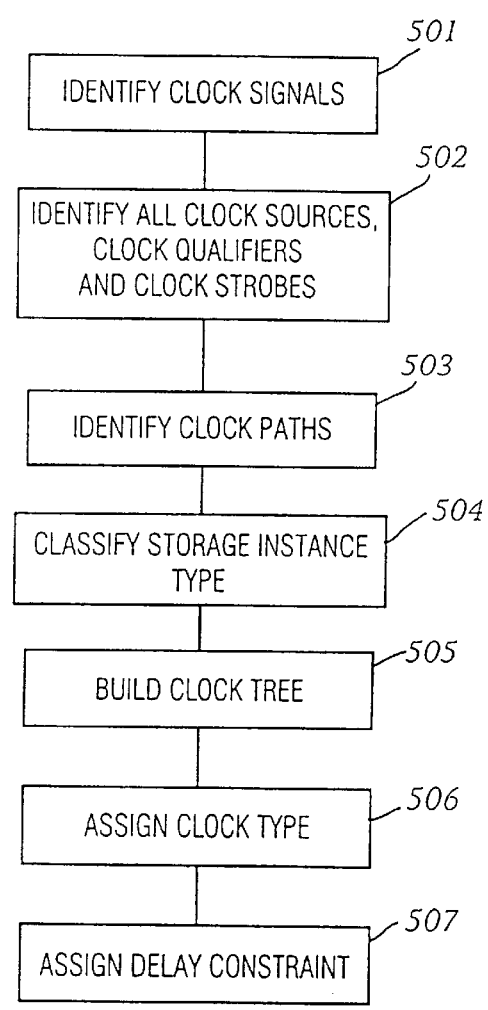
FIG. 5 is a block diagram showing the various steps in clock analysis module 402 of FIG. 4, in accordance with the present invention.

After the netlist is imported, a clock analysis module (represented by block 402 in FIG. 4) is invoked to perform an analysis of the clock structure of the netlist. Clock analysis module 402 performs the steps shown in FIG. 5. As shown in FIG. 5, represented generally by block 501 is the step identifying all clock signals. A clock signal is a signal, other than a power signal, which is connected to a clock input terminal of a storage instance (e.g. a register) either directly or by a "singular path". A singular path is a signal path or net comprising combinatorial gates each having a single output signal derived from either (i) a single input signal, or (ii) multiple input signals, one of which being a signal from a singular path, and the remaining signal or signals being power signals. Clock analysis module 402 traces back by a breadth first search from each clock input terminal of the storage instance and mark either (i) the clock signal itself, if the clock signal is not a signal in a singular path, or (ii) the signal in the singular path furthest away from the clock input terminal of the storage instance, if the clock signal is in a singular oath.

Figure 7:
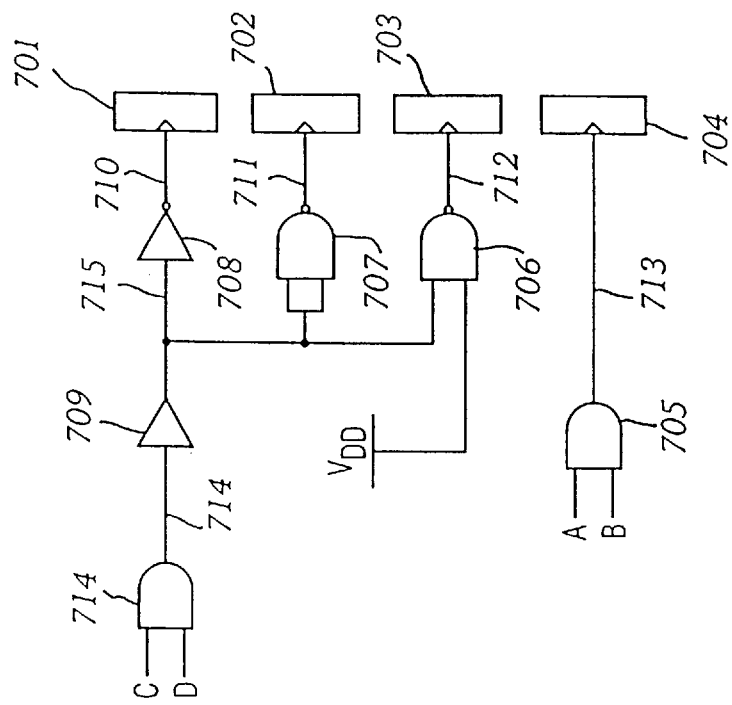
FIG. 7 illustrates certain steps in clock analysis module 402 which identifies and marks clock signals, in accordance with the present invention.

To illustrate the clock signals which are marked by clock analysis module 402, two examples are provided in FIG. 7. In FIG. 7, as well as throughout this detailed discription, storage instances are exemplified by D-flip flops. However, one of ordinary skill will appreciate that the principles illustrated herein are equally applicable to other storage instances, such as J-K flip flops, cross-coupled SR latches, transparent latches and other variations. As shown in FIG. 7, storage instances 701–704 are clocked respectively by signals 710–713. Also, none of the different signals labelled A, B, C, or D is a power signal. According to the definition of a singular path provided above, signal 713 is not in a singular path because neither one of the input signals A and B of AND gate 705 is a power signal. Accordingly, signal 713 is marked as a clock signal. By contrast, each of signals 710–712 is in a singular path. For example, since signal 710 is derived from signal 714 through the data path formed by invertor 708 and buffer 709, which are each a device having a single output signal derived from a single input signal, signal 710 is in a singular path. Also, signal 711 is in a singular path consisting of NAND gate 707 and buffer 709 because, even though NAND gate 707 has two input terminals, the same input signal is provided to both input terminals of NAND gate 707. Finally, signal 712 is in a singular path because NAND gate 706 is connected to signal 715 and VDD, which is a power signal. Thus, for each of these nets, clock analysis module will trace back, from output terminal to input terminal in each of the combinatorial gates, to mark signal 714 as a clock signal.

Having identified all clock signals, clock analysis module 402 then marks, in step 502, all user specified clock sources, clock qualifiers and clock strobes. In this embodiment, a clock source is a primary input terminal specified by the user to be a clock source; a clock qualifier is any signal which is used to gate a clock signal; and a clock strobe (e.g. the I/O write signal) is a primary input terminal or an internal net from which one or more clock signals are derived through combinatorial circuits only. A signal can be both a clock strobe and a clock source.

In addition, at step 502, clock analysis module 402 marks all identifiable clock qualifiers. Identifiable clock qualifiers are marked in the following manner.

First, every signal specified by the user as a clock qualifier is so marked.

Figure 8A:
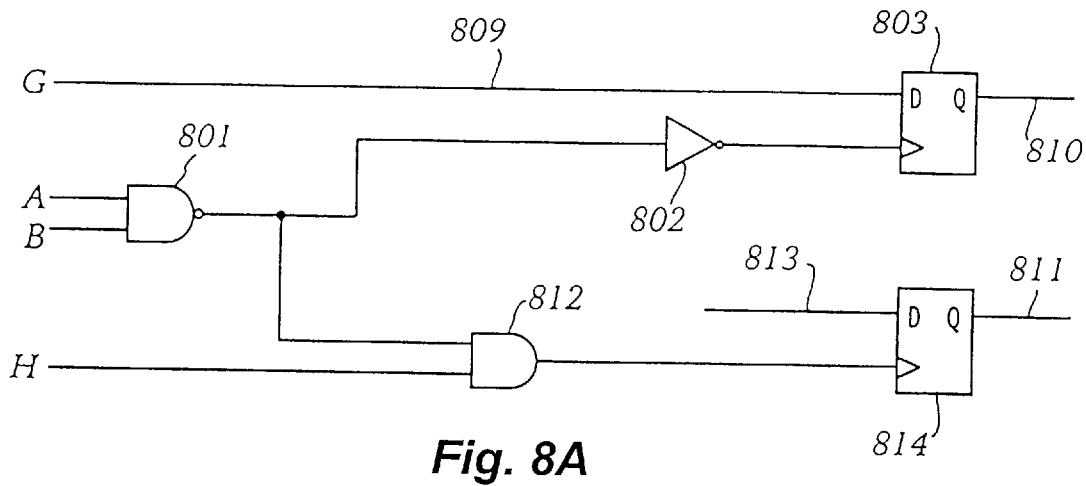
FIGS. 8a and 8b illustrate certain steps in clock analysis module 402 for identifying automatically certain clock qualifier signals from user specified clock strobes and clock sources, in accordance with the present invention.

Second, starting from user specified clock strobes, clock qualifiers are located in the manner illustrated by FIG. 8a. Starting from each user specified clock strobe, clock analysis module 402 traces through combinational circuits to derive signal nets from each clock strobe, and marks as clock qualifiers the output signals of each storage instance which receives a clock input signal from such signal nets. Thus, in FIG. 8a, if signal A is specified as a clock strobe, clock analysis module 402 traces through combinatorial gates 801 and 802 to the clock terminal of storage instance 803, and traces through combinatorial gates 801 and 812 to the clock terminal of storage instance 814. Thereafter, clock analysis module 402 marks as clock qualifier signals the signals at synchronous data output terminals 810 and 811 of storage instances 803 and 814, respectively.

Figure 8B:
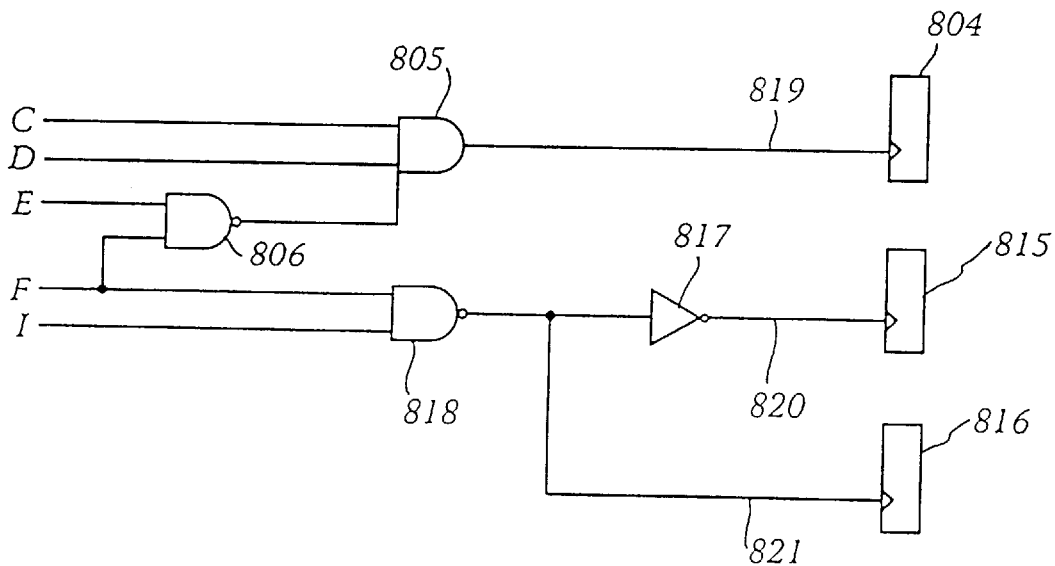

Also starting from each user specified clock source, at step 502, clock analysis module 402 traces all signal paths ("forward tracing"), using a breadth first search, to all clock signal input terminals of storage instances reachable through combinatorial circuits and storage instances. After all clock sources have been traced, clock analysis module 402 backtracks through each signal path to mark as clock qualifiers all input signals of the combinatorial gates and all data input signals of storage instances encountered, except for the signals on the signal paths found by the forward tracing. For example, in FIG. 8b, if signal F is specified a clock source, clock analysis module 402 traces through combinatorial gates 806 and 805 to the clock input terminal of storage instance 804, through combinatorial gate 818 to the clock input terminal 821 of storage instance 816, and through combinatorial gates 818 and 817 to clock input terminal 820 of storage instance 815. Thereafter, clock analysis module 402 backtracks to mark each of signals C, D, E and I a clock qualifier, unless the signal is in a signal path between another clock source and a clock input terminal of a storage instance.

Finally, clock qualifiers are "propagated" by examining each logic gate receiving one or more clock qualifiers. If every input signal received by the logic gate is either a clock qualifier or a power signal, the output signal is marked clock qualifier. Each combinational logic gate receiving the new clock qualifier is then examined to see if the logic gate's output signal can be marked clock qualifier. This procedure of propagating clock qualifiers are repeated until no new clock qualifier can be marked.

The step following identification of clock sources, clock qualifiers and clock strobes is indicated by block 503. In block 503, using a breadth first search, clock analysis module 402 identifies all clock paths by tracing from the clock input terminal or terminals of each storage instance to a clock source marked in the previous step 502, or a "parent" clock signal. A parent clock signal of a given clock signal is a clock signal in the clock path between the given clock signal and a clock source. In this embodiment, a clock path cannot include a net marked clock qualifier, but includes signal paths going (i) through an input and an output of a combinatorial circuit, (ii) through a clock or asynchronous control input terminal of a storage instance (e.g. an asynchronous set or reset signal) to a data output terminal of the storage instance, or (iii) through data input and output terminals of a storage instance, if the clock input terminal of such storage instance receives a power signal. Part (iii) of the above definition of a clock path is particular useful when emulating circuits having transparent latches clocked by power signals. A latch clocked by a power signal is treated as combinatorial logic gate by the present embodiment. Since clock qualifiers cannot be part of a clock path, significant amount of search time is saved by marking these signals in step 502.

Figure 9:
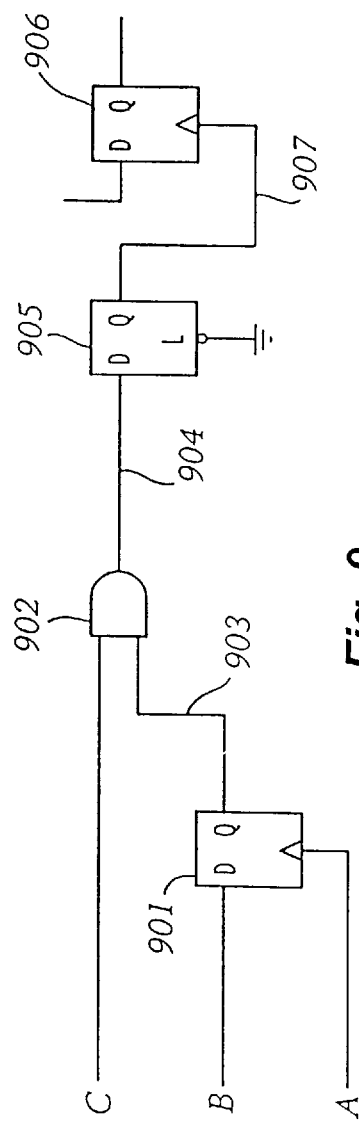
FIG. 9 illustrates certain steps in clock analysis module 402 for identifying clock paths for each storage instance, in accordance with the present invention.

FIG. 9 illustrates the process of identifying clock paths. In FIG. 9, signal C is a signal marked clock qualifier at step 502, and signal A is marked a clock source. Thus, beginning at signal 907 of the storage unit 906, a breadth first search traces to signal 904 through storage unit 905, which has a clock input terminal coupled to ground voltage. When tracing through storage instance 905, clock analysis module 402 first traces through the clock input terminal of storage unit 905. However, upon detecting that the clock input terminal of storage instance 905 is tied to the ground signal, clock analysis module 402 continues tracing through signal 904 at the synchronous data input terminal of storage unit 905. From signal 904, clock analysis module 402 traces through combinatorial gate 902, but ignores the path through signal C, which is marked clock qualifier, to follow signal 903 to the synchronous data output signal of storage unit 901. From signal 903, clock analysis traces through storage instance 901 to signal A, which is a clock source. Thus, the clock path of storage unit 907 includes storage instances 901 and 905, and combinatorial gate 902.

After identifying clock paths in step 503, clock analysis module 402 examines, in step 504, each storage instance to determine if the storage instance can be classified into one of four types, according to data paths leading into the storage instance's synchronous data input terminal. A data path is defined as a signal path between the storage instance's synchronous data input terminal and either (i) a clock source or clock qualifier signal ("clock qualifier path"), (ii) a primary input terminal ("external data path"), other than a clock source or clock qualifier signal, or (iii) a data output terminal of another storage instance ("internal data path"), other than a clock source or a clock qualifier signal.

Figure 10:
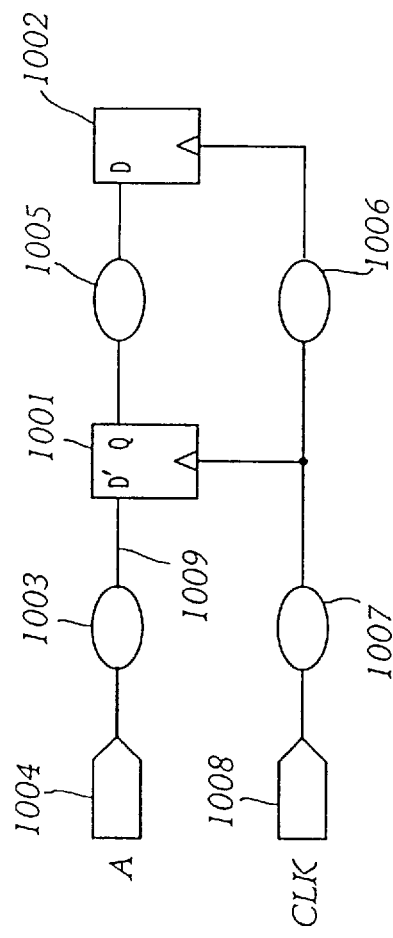
FIG. 10 illustrates three types of data paths: external data paths, internal data paths and clock qualifier paths, in accordance with the present invention.

These three types of data paths are illustrated in FIG. 10. In FIG. 10, both signal CLK and signal A are primary input signals, provided respectively at primary input pins 1004 and 1008. Further, signal CLK is a primary input signal specified as a clock source. Data path 1003 of storage instance 1001 is classified as an "external data path," if signal 1009 is not specified as a clock qualifier, and as a "clock qualifier path," if signal 1009 is specified as a clock qualifier. Finally, data path 1005 is classified as an "internal data path,"

Regardless of the data path type, a data path goes through only (i) combinatorial circuits, (ii) a storage instance between an asynchronous control input terminal (e.g. asynchronous set or reset) of the storage instance and a data output terminal of the storage instance or (iii) a storage instance between a data input terminal of the storage instance and a data output terminal of the storage instance, if the storage instance is clocked by a power signal.

Figure 11:
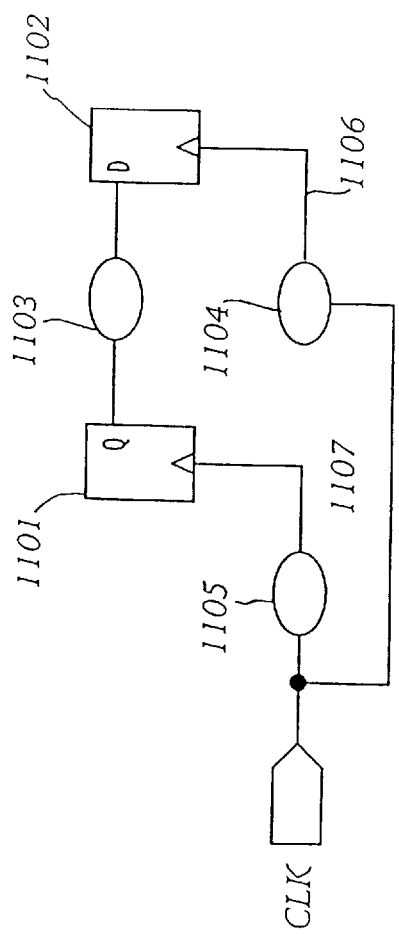
FIG. 11a and FIG. 11b illustrate certain steps of classifying storage instances in clock analysis module 402 into "same clock" and "different clock types" respectively, in accordance with the present invention.

If all data paths leading to a storage instance's data input terminal are clock qualifier paths, clock analysis module 402 classifies each such storage instance "clock generation." If all of the data paths are external data paths, but not all primary input terminals of these external data paths are clock qualifiers, clock analysis module 402 classifies such storage instance "external." However, if the data input terminal of a storage instance ("present storage instance") has at least one internal data path, and all such internal data paths originate from storage instances clocked by a the same clock signal as the present storage instance, clock analysis module 402 classifies the present storage instance "same clock". FIG. 11b shows an example of a "same clock" storage instance 1152, having a single data path to its synchronous data input terminal originating from storage instance 1151, which is clocked by the same clock signal as storage instance 1151. However, if the present storage instance has at least one internal path originating from a storage instance clocked by a different clock as the clock signal clocking the present storage instance, clock analysis module 402 classifies the present storage instance "different clock". FIG. 11a provides an example of a different clock storage instance 1102. As shown in FIG. 11a, storage instances 1101 and 1102 are clocked by clock signals 1106 and 1107, which are both derived from clock source CLK. If clock paths 1104 and 1105 are not identical and each comprise more than a singular path, then signals 1106 and signal 1107 are different clocks and thus storage instance 1102 is classified as "different clock."

After step 504, clock analysis module 402 builds, at step 505, clock trees for each clock source to provide subsequent software modules a data structure for quickly determining the relationship between any pair of clock signals. Each clock tree is rooted at the clock source, and depending on whether one clock signal is derived from another, any pair of clock signals in the clock tree can have either a "parent-child" relationship, or a "sibling" relationship with each other. For example, referring to FIG. 11a, clock signal CLK has a parent-child relation with each of clock signals 1106 and 1107, since both clock signals 1106 and 1107 are derived from clock signal CLK. Clock signals 1106 and 1107 has a sibling relationship between them, since both clock signals 1106 and 1107 are derived from clock signal CLK, but not from each other.

Any pair of clock signals from different clock trees are assumed "asynchronous." Of course, the user can specify if a "parent-child" relationship or "a sibling" relationship between input clock signals provided on primary input terminals. When a pair of input clock signals are so specified by the user, clock analysis module 402 will accordingly build a common clock tree for clock signals derived from these input clock signals.

After the clock trees are constructed at step 505, clock analysis module 402 analyzes the clock trees to select a predetermined number of clock signals for implementing in a clock generation FPGA. These clock signals generated by the clock generation FPGAs are called "global clock" signals, and are used to derive other clock signals. In the present embodiment, the clock paths of eight global clock signals can be implemented in a clock generation FPGA. Other clock signals are derived from the global clock signals, which act as "internal clock sources," using logic in the clocked FPGAs. Clock signals which supplies less than a certain number of storage instances are called "small clocks." Clock signals that are intended solely to generate other clock signals are called "generator clocks". A clock signal which is neither a generator clock, a global clock or a small clock is called a "local clock." Within an FPGA, all clock signals are distributed by clock buffers on long lines, except for small clocks. Small clocks are not distributed by a clock buffer, since clock buffers in each FPGA are scarce resources. However, in almost all practical implementations, small clocks are also routed by long lines. In the present embodiment implemented in FPGAs from Xilinx Corporation, by using clock buffers, which provide control of clock skews, and long lines, which provide minimum interconnect delay, local clock signals can reach any part of an FPGA in substantially less than the interconnect delay than a switch line. In fact, in the present embodiment, for a clock signal distributed by a clock buffer, the clock skew of the clock signal between any two points in the programmable logic device is insignificant, when compared to a data path delay.

Figure 12:
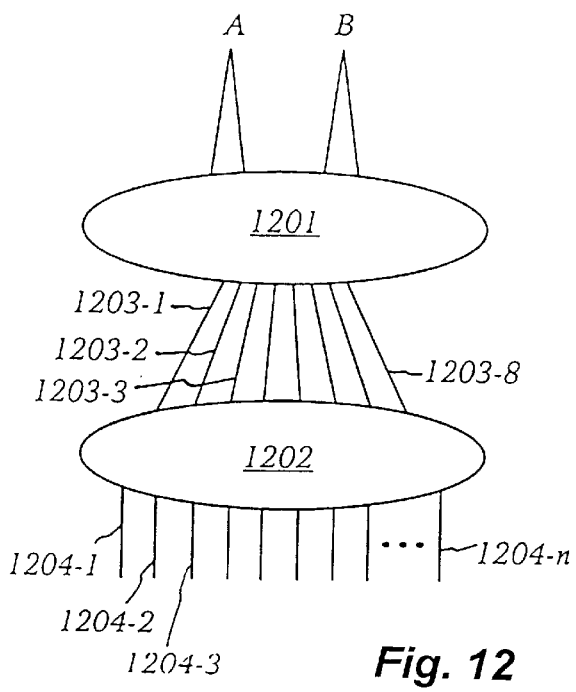
FIG. 12 illustrates certain steps of implementing clock paths in clock analysis module 402, for implementing "small clocks," "global clocks" and "local clocks," in accordance with the present invention.

FIG. 12 illustrates schematically the partitions between "global" and "local" clock paths. In FIG. 12, two clock sources A and B are roots to two clock trees generating clock signals 1204-1 to 1204-n. Clock analysis module 402 then finds eight global signals 1203-1 to 1203-8 from which all other clock signals 1204-1 to 1204-n can be generated. The portions of the clock paths ("global clock paths") between the global clock signals 2 and the clock sources, represented by clock paths 1201 are implemented in the clock generation FPGA. The remaining portions of the clock paths ("local clock paths"), represented by clock paths 1202, are implemented in clocked FPGAs.

Figure 13A:
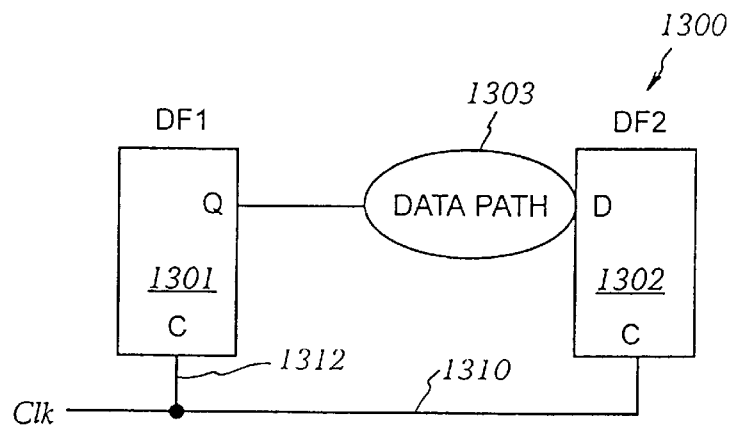
FIGS. 13a and 13b illustrate the effects of introducing interconnect delays by an emulation circuit implemented in programmable logic devices, such delays leading to an error condition known as "hold time violation artifact."
Figure 13B:
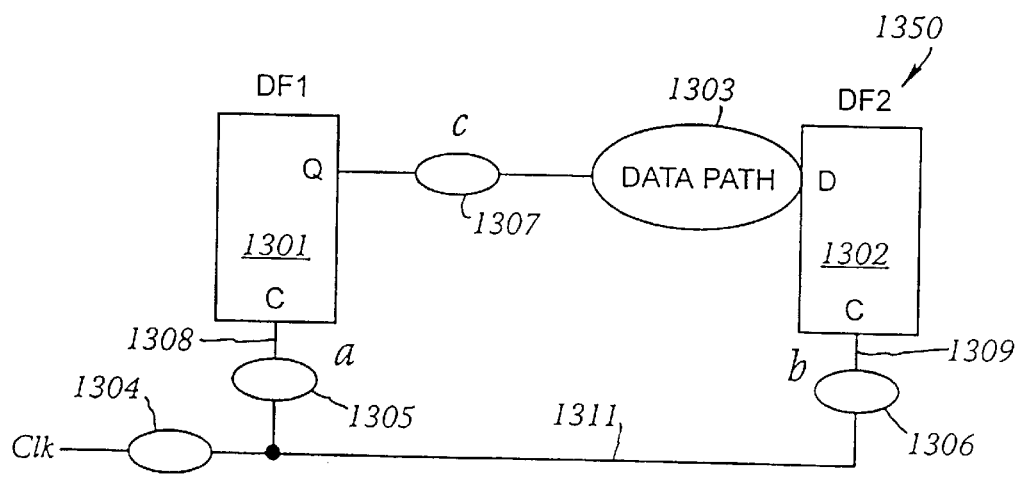

At the final step 507 of clock analysis module 402, delay constraints are assigned. A delay constraint is imposed to eliminate the "hold time violation artifact," which is illustrated by FIGS. 13a and 13b. For a target logic circuit to be functionally emulated in a logic block module, the interconnect delay introduced by the emulation circuit into clock signals should not cause a timing requirement to be violated in the emulation circuit, if the target logic circuit does not have such timing violation. FIG. 13a shows a circuit 1300 of the target logic circuit. In FIG. 13a, two storage instances 1301 and 1302 are clocked by clock signal Clk, and there exists a data path 1303 between the data output terminal of storage instance 1301 and the data input terminal of storage instance 1302.

When the target logic circuit is emulated in a logic block module, because of the interconnect structure of a clocked FPGA device, a general model for describing the timing differences between the emulation circuit 1350 and the target logic design 1300 can be obtained by introducing interconnect delay elements 1304, 1305, 1306 and 1307 into the clock and data paths of target logic circuit 1300. In FIG. 13b, clock signal 1308 received by the clock input terminal of storage instance 1301 is the clock signal CLK delayed by interconnect delay elements 1304 and 1305. Likewise, clock signal 1309 received by the clock input terminal of storage instance 1302 is clock signal Clk delayed by interconnect delay elements 1304 and 1306. Data path 1303 is also shown to be delayed by interconnect delay element 1307.

To ensure that emulation circuit 1350 is functional, emulation circuit 1350 must satisfy the requirement that the delay introduced by interconnect delay elements 1306 cannot exceed the interconnect delay 1305 by more than the delay of interconnect delay element 1307. Otherwise, a hold time violation at storage instance 1302's data input terminal may result from the propagation of a possible change in storage element 1301's data output signal arriving too early, thereby corrupting the value at the data input terminal of storage instance 1302, prior to the time the previous value is latched by the transition of clock signal 1309. Since this hold time violation is not due to an error in target logic circuit 1300's design, such artifact resulting from improper implementation of emulation circuit 1350 is particularly undesirable because substantial unproductive time and resources may be required to manually eliminate such artifact from emulation circuit 1350.

Although FIG. 13a and 13b show same clock storage instances, the analysis for different clock storage instances are substantially similar. One of ordinary skill will appreciate that the different clock storage instance case is obtained by substituting a clock path for each of the direct connections 1310 and 1312 between the clock source and the respective clock input terminals of storage instances 1302 and 1301. In that situation, hold time violation artifact can also occur when the delay introduced by interconnect delay element 1306 exceeds the delay introduced by the interconnect delay element 1305 by more than the delay introduced by interconnect delay element 1307 in the data path. In fact, hold time violation artifact can be worse than the same clock storage instance case because the delay elements 1305 and 1306 introduced to the different clock paths may be substantially different.

The present invention eliminates such hold time violation artifact by imposing a delay constraint. In the present embodiment, this delay constraint provides that two storage instances having an internal data path between them and clocked by different clock signals from the same clock source (i.e parent-child or sibling clock signals) should preferably be implemented on separate clocked FPGAS, and interconnected by an unclocked FPGA, unless the storage instance at whose data input terminal the data path terminates is clocked by a parent signal of the clock signal clocking the storage instance at whose data output terminal the data path begins. Note that, in the present embodiment, it is unnecessary to impose delay constraints on same clock storage instances. This is because, as will be demonstrated below in conjunction with FIG. 14, the delay due to a clock buffer or a long line used to implement a local clock is substantially less than the interconnect delay in the switch lines used to interconnect components in the data path.

Figure 14:
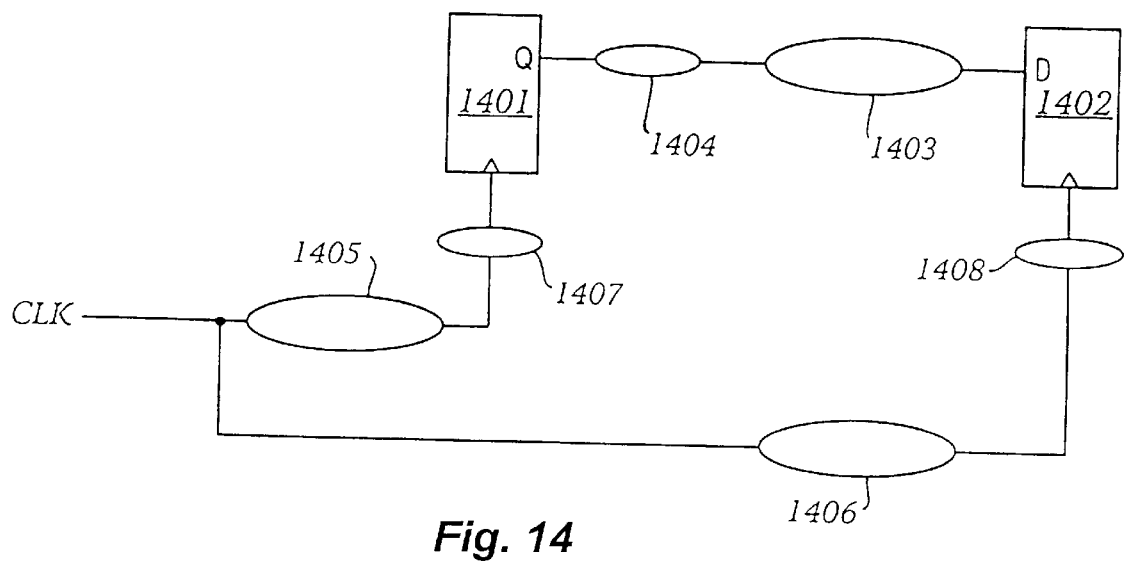
FIG. 14 illustrates a delay constraint imposed on different clock storage instances to avoid hold time violation artifact, in accordance with the present invention.

The operation of this delay constraint is illustrated by FIG. 14. FIG. 14 shows two storage instances 1401 and 1402 having, in the target logic circuit, data path 1403 between a data output terminal of storage instance 1401 and a data input terminal of storage instance 1402. The interconnect delay elements introduced by emulation are shown in the data path and the clock paths respectively as interconnect delay elements 1404, 1407 and 1408. The case of different clock storage instances are first considered. In that situation, although both storage instances 1401 and 1402 have a common clock source CLK, clock paths 1405 and 1406, which are respectively the clock paths of storage instances 1401 and 1402 are different. The delay constraint of the present invention provides that the storage instances 1401 and 1402 should preferably be implemented in separate clocked FPGAs interconnected using an unclocked FPGA. Consequently, assuming for the moment that clock source CLK is an internal clock source, clock paths 1406 and 1405 are implemented in the respective clocked FPGAs of storage instances 1401 and 1402 using clock buffers and long lines. Thus, as mentioned above, the interconnect delay elements 1407 and 1408 introduced by the emulation circuit are each substantially less than the delay of a switch line connection. However, since the significant delay of interconnect delay element 1404 is introduced by using the interchip delay through the unclocked FPGA and interconnecting the data path 1403 by switch lines, the difference in interconnect delay in the clock signals is much less than the interconnect delay in the data path. Thus, the delay constraint adds sufficient delay to data oath 1403 to ensure that hold time violation artifact does not occur between storage instances 1401 and 1402.

The case of same clock storage instances are next considered. FIG. 14 can also represent same clock storage instances, if clock paths 1405 and 1406 are identical. In that case, it is clear that, by implementing storage instances in separate clocked FPGAs and interconnecting the data path 1403 through an unclocked FPGA will result in overcoming hold time violation artifact in substantially the same manner as the different clock storage instance case. However, this delay constraint is not necessary in the present implementation for same clock storage instances. This is because, even when same clock storage instances 1401 and 1402 are implemented in the same clocked FPGA, the interconnect delay elements 1407 and 1408 introduced by emulation correspond to delays in the clock buffers and long lines of the clocked FPGA, since local clock paths are implemented through clock buffers and long lines providing both clock skew controls and minimum propagation delay. By contrast, the interconnect delay element 1404 introduced by the emulation circuit into data path between storage instances 1401 and 1402 are implemented over general switched lines.

In this embodiment, the delay difference in the interconnect delay elements 1407 and 1408 is always less than the interconnect delay element 1404 through general switched lines. Thus, delay constraints are not imposed on same clock instances in this embodiment.

Figure 15:
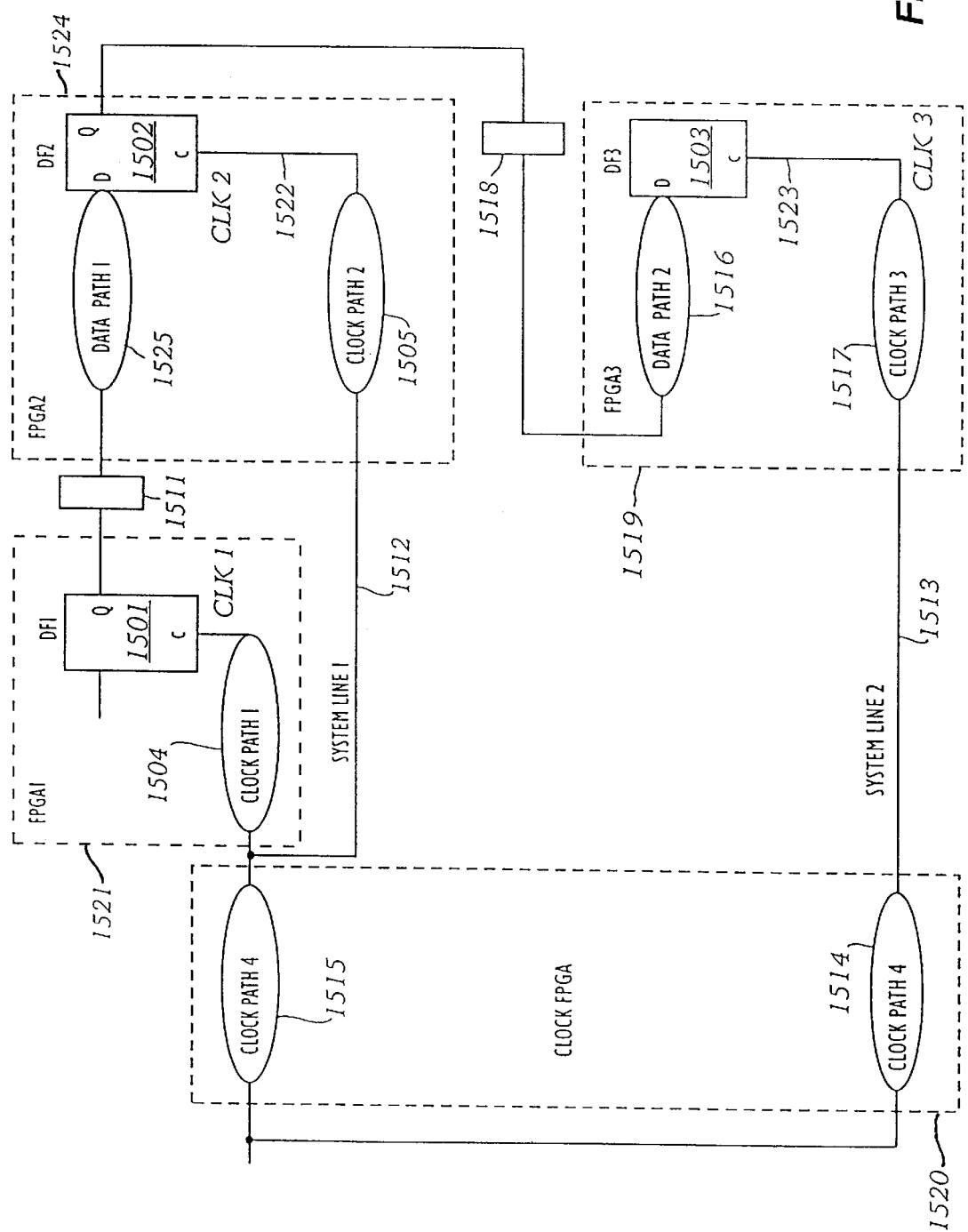
FIG. 15 illustrates the operation of the delay constraint of the present invention in a more complex situation than FIG. 14; namely, when portions of the clock paths from a common clock source in a different clock storage instance are implemented in the clock generation FPGA.

A complex example involving delay constraints in two pairs of storage instances is illustrated by FIG. 15. As shown in FIG. 15, delay constraints are placed between storage instances 1502 and 1503, and between storage instances 1501 and 1502. Since the clock signals of storage instances 1501 and 1502 are derived from the same global clock signal 1512, substantially similar to the relation between clock signals of storage instances 1401 and 1402 of FIG. 14, the manner in which the delay constraint between storage instances 1501 and 1502 prevents hold time violation artifact is substantially the same as described above with respect to storage instances 1401 and 1402 of FIG. 14. A description of how the delay constraint operates to prevent hold time violation artifact between storage instances 1501 and 1502 is therefore omitted.

However, the clock signals of storage instances 1502 and 1503 are sibling clock signals 1522 and 1523, each having a portion 1514 or 1515 of their respective clock path in clock generation FPGA 1520. The interconnect delay introduced to the clock signal 1522 of storage instance 1502 is the sum of (i) the interconnect delay of clock path 1515 in the clock generation FPGA 1520, and (ii) the interconnect delay of internal clock path 1505 in the clocked FPGA 1524. Likewise, the interconnect delay introduced to the clock signal 1523 of storage instance 1503 is the sum of (i) the interconnect delay of clock path 1514 in the clock generation FPGA 1520 and (ii) the interconnect delay of clock path 1517 in the clocked FPGA 1519. Again, because long lines and clock buffers are used for routing global clock signals in clocked FPGAs, and in the clock generation FPGA, each interconnect delay introduced into clock paths 1515, 1505, 1514 and 1517 is substantially less than the delay of general switched interconnections through an FPGA. Thus, the difference in interconnect delays in the total clock paths of storage instances 1502 and 1503 is less than general switched interconnections and the interchip delay through an unclocked FPGA 1518, such as required by the delay constraint between clusters 1502 and 1503. Thus, the delay constraint of storage instances 1502 and 1503 also prevents hold time violation artifact in data path 1516 between storage instances 1502 and 1503, even though parts of the clock paths of storage instances 1502 and 1503 are implemented in clock generation FPGA 1520.

Figure 6:
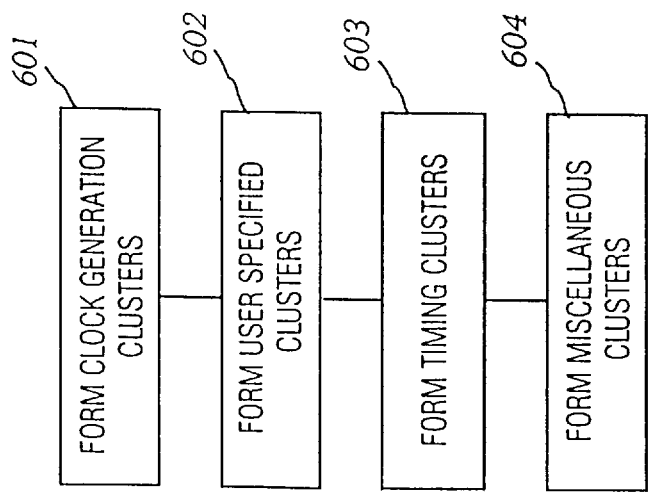
FIG. 6 is a block diagram showing certain steps of clustering module 403 of FIG. 4, in accordance with the present invention.

Upon completion of a clock analysis by clock analysis module 402, a clustering module (represented by block 403 of FIG. 4) is invoked to collect storage instances and their clock and data paths for circuit partitioning at a subsequent step. The subsequent partition step implement connected clusters components in the same FPGA whenever possible, so as to minimize interconnections between clocked FPGAs, which are connected through unclocked FPGAs at the expense of interchip interconnect delays. Clusters of the present embodiment can be implemented by conventional data structures, such as linked lists. FIG. 6 is a flow chart illustrating the steps performed by clustering module 403.

As shown in FIG. 6, clustering module 403 forms in step 601 a cluster for each clock generation storage instance. Ideally, all clock signals should be generated in the clock generation FPGA. However, in certain design, as explained above, because the present embodiment can support only the generation of eight clock signals in the clock generation FPGA, only the clock paths generating the global signals are clustered for implementation in the clock generation FPGA. Upon completing step 601, clustering module 403 sets up in step 602 clusters according to user specified constraints. In this embodiment, such user specified constraints include "terminal" and "component" clusters. Terminal clusters are clusters of primary I/O terminals for interfacing with a target system. Component clusters are clusters of components which the user considers important to be implemented in the same FPGA. An example of such a component cluster can be an asynchronous portion of the target logic circuit. These user's specified constraints are honored in step 602 to ensure that the timing clustering step 603 do not provide clusters which conflict with these constraints.

After completing step 602, clustering module 403 forms "timing clusters" in step 603. To form a timing cluster, each storage instance is clustered with.(i) components of its external and internal data paths ("data part"), and (ii) components of local clock paths ("clock part"). In addition, each output terminal is clustered with its data path. Further, all data paths leading to tristate buffers of an internal tristate bus form a cluster. FIG. 11a can be used to illustrate a timing cluster. Clustering module 403 forms a timing cluster including data path 1103, clock path 1104, and storage instance 1102. The data and clock parts are identified using breadth first searches starting respectively from the data input terminal of the storage instance and from the clock input terminal of the storage instance. In this embodiment, during clustering of a data part, input buffers of an external data path are identified so that an external data path can be treated the same way as the an internal data path.

Ideally, each cluster should include a number of components no larger than the size which can be handled by a single FPGA. However, if a cluster is formed having more components than can be implemented in an FPGA, such a cluster is broken up into smaller clusters along non-critical nets. Critical nets are specified by the user prior to running clustering module 403. Clustering module 403 will not use critical nets to break up a large cluster. To select a non-critical net for breaking up a cluster, clustering module 403 uses heuristic algorithms known in the art. Of course, nets that are separated into different FPGAs as a result of breaking up a large cluster are reported to the user, who can then adjust the list of critical nets, if the net selection by clustering module is unsatisfactory. Clustering module 403 can then be rerun for a different result. One heuristic for selecting a non-critical net selects the net in the cluster with the most fan-out.

Because a cluster is formed for each storage instance, some components of the design will be represented in multiple clusters. These components, which are present in multiple clusters, are termed "duplication".

The final step 604 of clustering module 403 forms clusters of the remaining components still to be clustered.

A connectivity module 404 provides a directed connectivity graph among the clusters. Because circuits implemented in separate clocked FPGAs are interconnected through an unclocked FPGA, it is desirable that clusters with high connectivity between them be implemented in the same FPGA whenever possible. The connectivity graph provided by connectivity module 404 guides the subsequent partition step to minimize interchip interconnections.

A connectivity graph of the clusters created by connectivity module 401 contains two types of nodes. Connectivity module 404 first creates "cluster nodes" in the connectivity graph to represent the clusters being formed in the previous step. Then, each signal in the target logic circuit is examined. If a signal is either an input signal or an output signal in each of the data paths of two or more clusters, a "signal node" is created with a directed edge connecting the signal node to each such cluster.

Figure 17B:
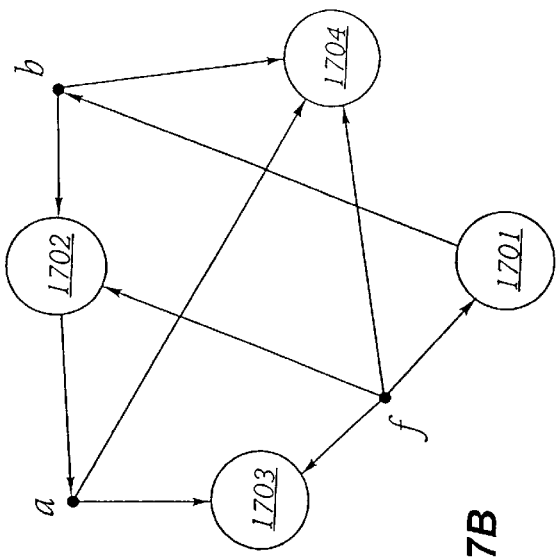
FIGS. 17a and 17b illustrate by a circuit 1700 how a connectivity graph is constructed by connectivity module 404, in accordance with the present invention; circuit 1700 is also used to illustrate the operation of duplication module 405.
Figure 17A:
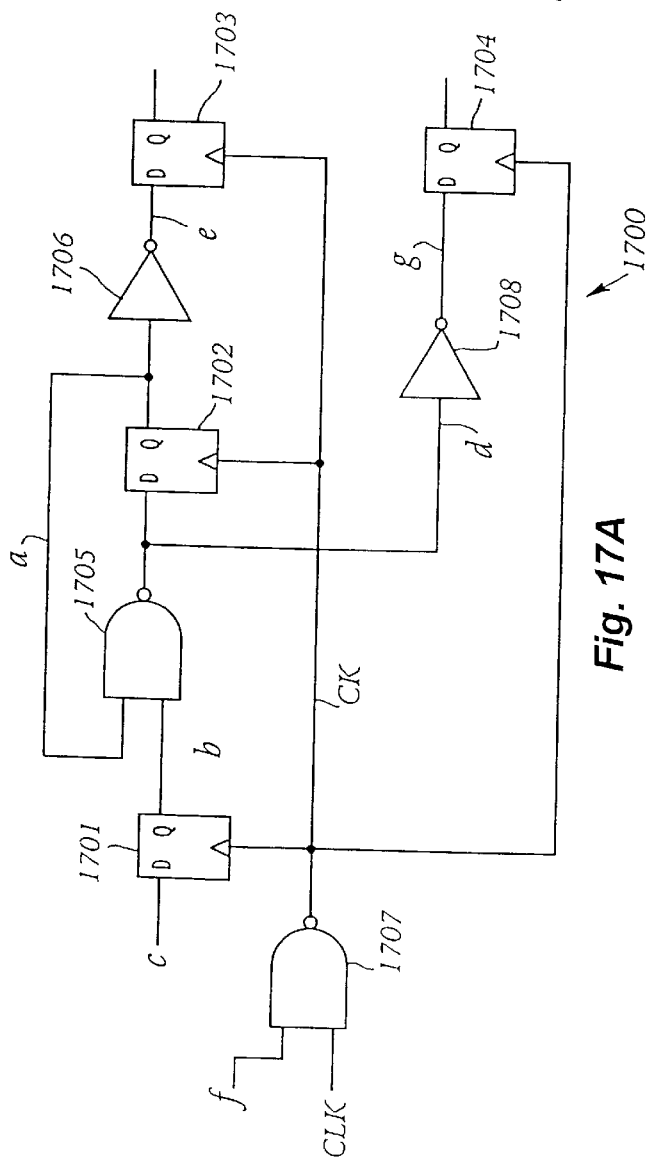

FIGS. 17a and 17b illustrate the connectivity graph of the present invention. In FIG. 17a, four storage instances 1701–1704 are clocked by a clock signal Ck, which is derived by gating a clock qualifier signal f with global clock CLK. For this example, assume that signal f is a data output signal of storage instance, such that signal f is an input signal to each of the clusters of storage instances 1701–1704. An output signal b of storage instance 1701 and a signal a are input signals to NAND gate 1705, which output signal d is latched by storage instance 1702. Signal a, which is an output signal of storage instance 1702, is inverted by inverter 1706 to provide signal e at a data input terminal of storage instance 1703. Signal d is inverted by inverter 1708 at a data input terminal of storage instance 1704. Thus, connectivity module 404 described above identifies in storage instance 1702's cluster data part signals a, b and d, and clock part signals f and Ck. In storage instance 1702's cluster, signals a, b, and f are input and output signals of the cluster. Since clock signal CLX is a global clock signal, clock signal CLK is not included in the clock part of storage instance 1702's cluster. Further clock signal Ck is an internal signal an internal signal to each of the clusters of storage instances 1701-1704.

Likewise, connectivity module 404 identifies data part signals a and e in storage instance 1703's cluster, in which signal a is an input signal of storage instance 1703's cluster. Simialrly, data part signals d and g are internal signals of storage instance 1704's cluster and signal b is an input signal of storage instance 1704's cluster. As mentioned above, each of the clusters of storage instances 1701–1704 has input signal f in their respective clock part. FIG. 17b shows the portion of connectivity module 404's connectivity graph involving the clusters of storage instances 1701–1704. In FIG. 17b, cluster nodes are shown as circles, and signal nodes are shown as solid dots.

Thus, as shown in FIG. 17b, since connectivity module 404 identifies clock part signal f in each of the clusters of storage instances 1701–1704, the connectivity graph shows a directed edge pointing from signal f to each of cluster nodes 1701–1704. Likewise, signal b, which is an input signal to both storage instance 1702's cluster and storage instance 1704's cluster, is shown in the connectivity graph of FIG. 17b as having a directed edge pointing to each of cluster nodes 1702 and 1704. Since signal b is also an output signal of storage 1701's cluster, a directed edge pointing from cluster node 1701 is provided.

Similarly, signal a, which is an input signal of the clusters of storage instances 1703 and 1704 and an output signal of storage instance 1702, has a directed edge pointing to each of the cluster node 1703 and 1704 and a directed edge originating from clusters 1702. Since both signals e and g are signals internal to their respective clusters, neither signals e nor g are represented in the connectivity module 404's connectivity graph.

After connectivity module 404 constructs the connectivity graph, a duplication module 405 (FIG. 4) stores with each component a list of the one or more clusters to which the component belongs. To allow such a list to be associated with each component, each component in the target logic circuit is associated with a conventional data structure, such as a linked list. For example, referring back to FIG. 17a, since NAND gate 1707 is in the clock part of the cluster of each of storage instances 1701–1704, NAND gate 1707 is provided a data structure indicating that NAND gate 1707 is common to the clusters of each of storage instances 1701–1704. Likewise, since NAND gate 1705 is common to both the cluster including storage instance 1702 and the cluster including storage instance 1704, NAND gate 1705 is associated with a data structure indicating that NAND gate 1705 is common to both the cluster of storage instance 1702 and the cluster of storage instance 1704. Inverters 1706 and 1708, each belonging only to the cluster of storage instance 1703 or the cluster of storage instance 1704, are each associated with a data structure indicating to their respective clusters.

The connectivity graph created by connectivity module 404 and the duplication list associated with each component provided by duplication module 405 are used by partition module 406 in the next step to determine the partitioning of target logic circuit among the available programmable logic devices of the logic block module.

Partition module 406 partitions the target design according to the connectivity amongst the clusters. Partition module 406 seeks to minimize interconnection through unclocked FPGA by assigning clusters with substantial common signals to the same FPGA. A conventional metric weighted by both connectivity and any delay constraint between two clusters are used to determine if the two clusters are to be implemented in the same FPGA. When two clusters are implemented in separate clocked FPGAs, signals connecting the two clusters are routed through an unclocked FPGA to provide the interconnection. Because an entire cluster is assigned to an FPGA, interconnections between FPGAs are necessary only at the common signals which are input and output signals of the two clusters. It is believed that such common signals are few in number because of prevailing design methodologies. Thus, the present invention minimizes interchip connections. Because interchip connections are minimized, a larger number of components than previously possible can be implemented in an FPGA before the I/O pins of an FPGA become limiting. Consequently, the present invention provides a much higher utilization of the logic gates in an FPGA than the utilization of logic gates achieved by the prior art.

When two clusters are assigned to different clocked FPGAs, the components common to the two clusters are duplicated in both FPGAs. Thus, the common signals internal to the data path of each cluster need not be routed between the two FPGAs. For example, in FIG. 17a and 17b, signal d is internal to the data part of both the cluster including storage instance 1702 and the cluster including storage instance 1704. Since component 1705 is duplicated, interconnection of signal d across FPGAs is not required. Of course, when two clusters are implemented on the same clocked FPGA, these internal common signals can be routed by general switched lines, if they are common signals in the data parts of the clusters, and on long lines if they are common signals in the clock parts of the clusters. Not only does duplication minimize interchip connections, and thereby increases utilization of the logic resources of the FPGAs, duplication also minimizes data path delays by avoiding interchip interconnections.

The algorithm for implementing partition module 406 is substantially similar to other partition algorithms well known in integrated circuit design, and can be implemented by modifying one such algorithm using techniques possessed by one of ordinary skill.

Figure 16A:
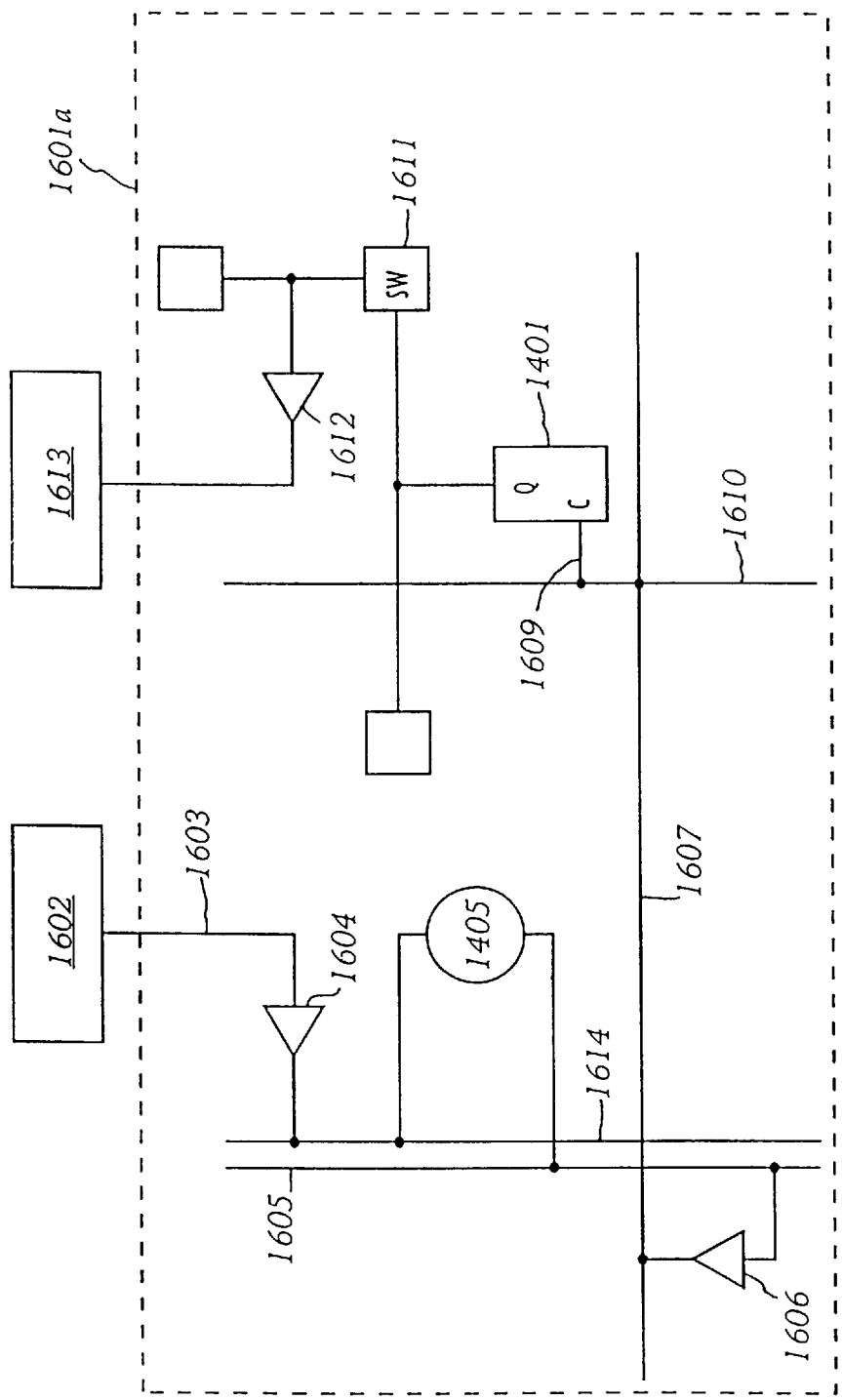
FIGS. 16a and 16b show an implementation of FIG. 14's storage instances 1401 and 1402 in unclocked FPGA 1613 and separate clocked FPGAs 1601a and 1601b, in accordance with the delay constraint of FIG. 14.
Figure 16B:
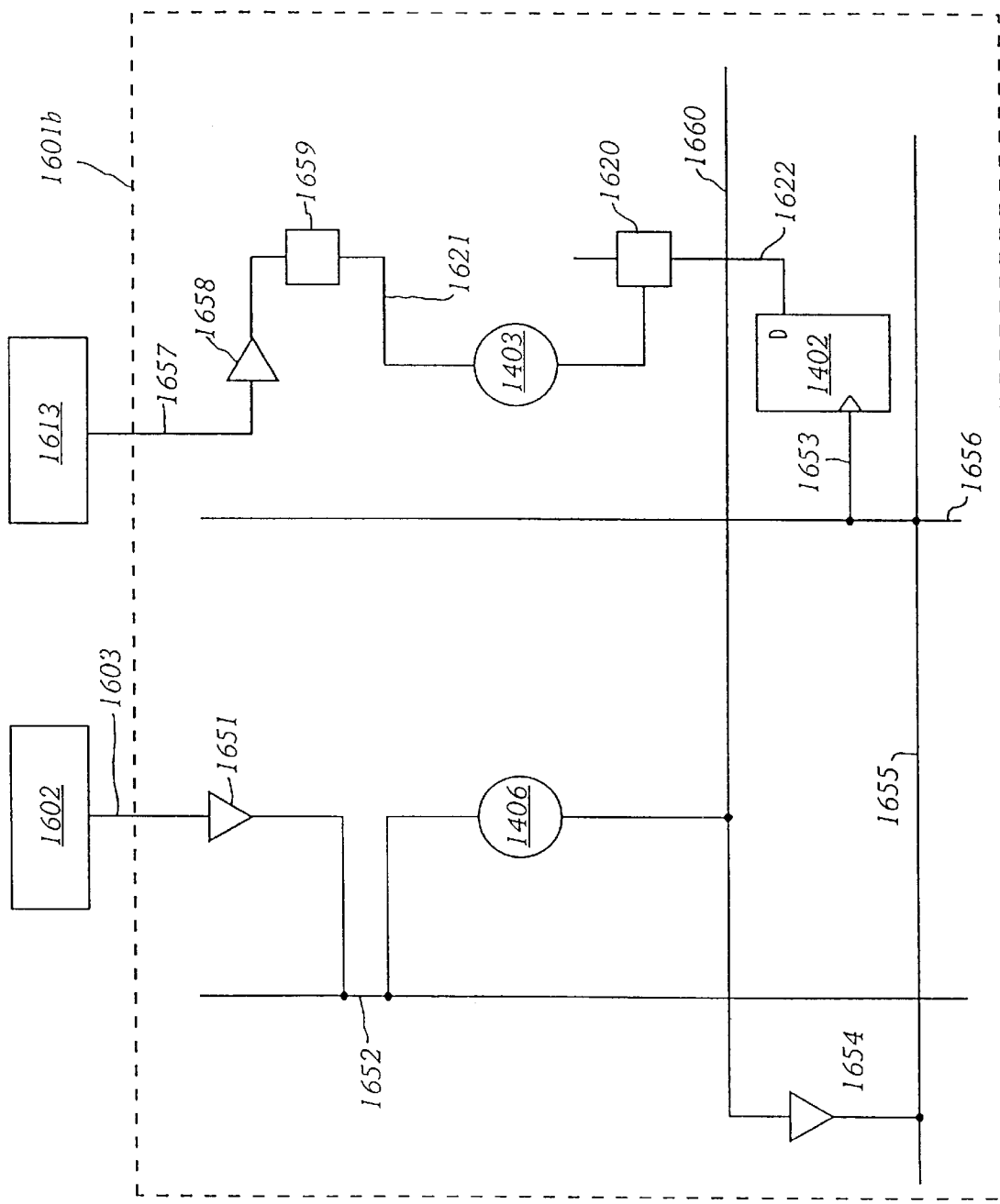

FIGS. 16a and 16b illustrate an implementation of FIG. 14's delay constraint by partition module 406. FIG. 16a shows the cluster including storage instance 1401 implemented in clocked FPGA 1601a. As shown in FIG. 16a, storage instance 1401 is implemented in one or more configurable logic blocks in FPGA 1601a. The global clock signal 1603 is provided by clock generation FPGA 1602 to I/O buffer 1604 and routed through a long line 1614 to the clock path 1405 implemented in one or more configurable logic blocks in clocked FPGA 1601a, which is configured to generate the clock signal at the clock input terminal 1609 of storage instance 1401. The clock signal generated by clock path 1405 is routed by long line 1605 to a clock buffer 1606 prior to reaching clock input terminal 1609 of clock instance 1401 over long lines 1607 and 1610. The portion of data path 1403 between clock instances 1401 and 1402 implemented in clocked FPGA 1601a is shown as the general switched signal path through general switch 1611 and I/O buffer 1612 to unclocked FPGA 1613.

FIG. 16b shows the cluster including storage instance 1402 implemented in the FPGA 1601b. As shown in FIG. 16b, storage instance 1402 is implemented in one or more configurable logic blocks in clocked FPGA 1601b. Again, the global clock signal 1603 is provided to I/O buffer 1651 and is routed through a long line 1652 to one or more configurable logic blocks of FPGA 1601b configured to implement clock path 1406, which generates the clock signal at the clock input terminal 1653 of storage instance 1402. The clock signal generated by clock path 1406 is routed over long line 1660 to clock buffer 1654 prior to reaching the clock input terminal 1653 of clock instance 1402 over long lines 1655 and 1656. The portion of data path 1403 between storage instances 1401 and 1402 implemented in clocked FPGA 1601b is shown in FIG. 16b as the signal path between input signal 1657 from unclocked FPGA 1613, and the data input terminal 1622 of storage instance 1402. Signal 1657 is routed through I/O buffer 1658, and the general switched signal path comprising switches 1659 and 1620, and switch lines 1621 and 1622, through one or more configurable logic blocks of clocked FPGA 1601b. These configuration logic blocks are configured to provide data path 1403. Since global clock 1603 arrives at both clocked FPGAs 1601a and 1601b substantially simultaneously because the metal traces connecting clock generation FPGA 1602 to clocked FPGAs 1601a and 1601b provide insignificant interconnect delay, the difference in interconnect delay introduced by emulation circuit when implementing clock paths 1405 and 1406 in FPGAs 1601a and 1601b is substantially less than the interconnect delay and the interchip delay introduced into the emulation circuit in the portion of data path 1403 in unclocked FPGA 1613. Thus, elimination of hold time violation artifact is assured by implementation of the delay constraint in clocked FPGAs 1601a and 1601b and unclocked FPGA 1613.

FIG. 18 illustrates how a logic block module 1802, e.g. logic block module 200 of FIG. 2, can be interfaced to a target system 1801, where the target logic circuit emulated by logic block module 1802 is expected to be deployed. In FIG. 18, a target system 1801, such as a printed circuit board, is connected to logic block module 1802 using two "pods" 1803a and 1803b. Each pod is connected to a corresponding one of I/O connectors 1804a and 1804b on the side of logic block module 1802, and a corresponding one of primary I/O terminals 1805a and 1805b on the side of target system 1801. Each primary terminal can be, for example, a socket arranged to received the pins of the target integrated circuit emulated by logic module 1801. Of course, the number of logic block modules which can be interfaced to a target system, and the number of pods shown in FIG. 18 are exemplary only. Many other configurations are possible. The pod connections of FIG. 18, i.e. between logic block module 1802 and pod 1803a or 1803b and between pod 1803a or 1803b and target system 1801, each represent multiple signal connections realized by a cable.

The construction of a pod, such as pod 1803a, is shown in FIG. 19. In FIG. 19, pod 1900 comprises a clocked FPGA 1901 connected to I/O connector 1902 clock I/O connector 1904 and probe or logic analyzer connector 1905 and primary I/O terminal connector 1903. I/O connector 1902 is connected to an I/O connector of a logic block module 1802, and the primary I/O terminal connector 1903 is connected to another primary I/O terminal connector in a target system. FPGA 1901 is provided to route the signals of I/O connector 1902 according to the expected pin-out of primary I/O connector 1902.

Tristate nets involving primary input and output pins in the target design are implemented in a pod between the logic block module and the target system.

After partition module 406 completes partitioning the design and assigns the partitions into the FPGAs and I/O connectors of a logic block module, the delay constraints between clusters are again revisited to ensure that hold time violation artifacts properly guarded against. Where a delay constraint is imposed on two clusters, but the two clusters are nevertheless assigned for implementation in the same FPGA due to strong connectivity between the clusters, delay elements are introduced into the data path to ensure that hold time violation artifacts are prevented. A system routing module then provides the interconnection for connecting the clocked and unclocked FPGAs of the emulation circuit. Thereafter, a configuration module 407 is invoked to translate the data output of partition module 406 into programs for configurating the FPGAs and I/O connectors of the logic block module into the emulation circuit. In the present embodiment, configuration module 407 is interfaced with a software supplied by Xilinx Corporation to generate the configuration programs.

The above detailed description is provided to illustrate the specific embodiments of the present invention and is not intended to be limiting. For example, although the present invention is described above using as examples field programmable gate array circuits, the present invention is not so limited. In fact, the present invention is applicable to any array of programmable logic devices, including an array of programmable gate arrays, an array of one time programmable gate arrays, or an array of mask programmable gate arrays. Further, the present invention is also applicable to an array of any programmable logic elements, including a semiconductor devices, as described above, a programmable printed circuit board assembly, or a programmable circuit block as part of a larger semiconductor device. Further, upon consideration of the above detailed description, the person of ordinary skill will appreciate that the delay constraint in the above described embodiment can be achieved within the scope of the present invention by, instead of requiring different clock storage instances be implemented in separate FPGAs, configuring suitable interconnect delay elements in the data paths between the different clock storage instances in the same FPGA, thereby achieving sufficient delays to avoid the hold time violation artifact.

Another variation within the scope of the present invention avoids hold time violation artifact due to data received from a primary I/O terminal over a data pod arriving at the data input terminal of a storage instance earlier than the clock signal clocking the storage instance. In such a condition, the present embodiment inserts delay elements to slow down the data path.

Other modification and variations within the scope of the present invention are possible. The present invention is defined by the following claims.

We claim:

1. In implementing an emulation circuit from a netlist description of a design, said design receiving a plurality of clock sources, a structure comprising:

means for importing said netlist description into a data structure representing said design;

means for analyzing said data structure to identify, for each storage instance receiving a clock signal in said design, a clock path connecting said clock signal to one of said clock sources from which said clock signal is derived; and means for implementing a portion of each clock path in a programmable logic device dedicated for clock generation.

2. A structure as in claim 1, further comprising:

means for identifying, for each of said storage instances, data paths starting from either (i) an output data terminal of another storage instance, or (ii) a input terminal of said design, and leading to an input terminal of said storage instance, said data paths including combinatorial circuits;

means for clustering, for each of said storage instance, said storage instance and said data paths in a cluster; and means for implementing said emulation circuit in a plurality of programmable devices using a method which prefers implementing the data paths and the storage instance of a cluster in the same programmable logic device to implementing said data paths and said storage instance of a cluster in separate programmable logic devices.

3. A structure as in claim 2, further comprising means for constructing a connectivity graph for identifying common signals between a pair of clusters, and wherein said means for implementing said emulation circuit uses a method which prefers implementing a pair of clusters having common signals in the same programmable logic device to implementing a pair of clusters having said common signals in separate programmable devices.

4. A structure as in claim 2, further comprising means for identifying common components between each pair of clusters, and wherein said means for implementing said emulation circuit duplicates, when said clusters are implemented in different programmable devices, said common components in each of said different programmable devices.

* * * * *